(12) United States Patent
Ozaki

(10) Patent No.: US 7,131,041 B2
(45) Date of Patent: Oct. 31, 2006

(54) SEMICONDUCTOR INTEGRATED CIRCUIT DEVICE AND DEVICE FOR TESTING SAME

(75) Inventor: Hideharu Ozaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/063,472

(22) Filed: Apr. 26, 2002

(65) Prior Publication Data

US 2003/0020451 A1 Jan. 30, 2003

(30) Foreign Application Priority Data

Jul. 30, 2001 (JP) ............................. 2001-229629

(51) Int. Cl.
*G01R 31/28* (2006.01)
(52) U.S. Cl. ..................... 714/724; 714/726
(58) Field of Classification Search .............. 714/726, 714/727, 729, 733, 734, 724, 731, 814; 324/765, 324/763; 814/734, 814
See application file for complete search history.

(56) References Cited

U.S. PATENT DOCUMENTS 5,519,715 A  5/1996  Hao et al.
5,524,114 A * 6/1996  Peng ........................... 714/724
5,614,838 A * 3/1997  Jaber et al. .................. 324/765
5,794,175 A * 8/1998  Conner ........................ 702/119

FOREIGN PATENT DOCUMENTS

EP   0 806 837 A2   11/1997
EP   1 024 367 A    8/2000
JP   8-201481       9/1996

* cited by examiner

*Primary Examiner*—James C Kerveros
(74) *Attorney, Agent, or Firm*—Scully, Scott, Murphy & Presser, P.C.

(57) ABSTRACT

A device for testing a semiconductor integrated circuit device has a test board on which the semiconductor integrated circuit device to be tested is removably mounted, and a two-pulse generator mounted on the test board, for generating two pulses spaced from each other by a pulse interval equal to the period of a test clock for the delay test, from the test clock, and supplying the generated two pulses to the scan path test circuit. The device also has a PLL circuit for multiplying the frequency of the test clock and supplying a signal having the multiplied-frequency to the two-pulse generator.

12 Claims, 8 Drawing Sheets

SEMICONDUCTOR INTEGRATED CIRCUIT DEVICE AND DEVICE FOR TESTING SAME

BACKGROUND OF INVENTION

1. Field of the Invention

The present invention relates to a semiconductor integrated circuit device and a device for testing such a semiconductor integrated circuit device, and more particularly to a semiconductor integrated circuit device suitable for a delay test using a scan path test circuit, and a device for testing such a semiconductor integrated circuit device.

2. Description of the Related Art

Semiconductor integrated circuit devices (hereinafter referred to as "LSI chips"), recently available in larger scale integration and higher densities, which are not designed for an easy testing configuration, cannot be tested and diagnosed for faults. One known approach for easy testing is a scan path process in which flip-flops in a semiconductor integrated circuit are connected into a chain pattern so as to operate as a shift register, and when the circuit is tested, the values of the flip-flops are controlled and observed from outside of the circuit based on the function as the shift register.

For testing an LSI chip according to the scan path process, the LSI chip incorporates a plurality of scan flip-flops which are flip-flops for use in normal operation and testing, and their input and output terminals for testing are connected in series, i.e., cascade, to connect the flip-flops as a shift register.

The scan flip-flops have a normal operating function to operate normally as ordinary flip-flops, and also have a scan function to operate as scan flip-flops with a scan clock SC as a testing clock while a scan-in signal SIN as a testing pattern signal is being supplied as a data input signal.

According to the scan path process, the scan-in signal SIN as a testing pattern signal is input to a scan path test circuit which is constructed of the cascaded scan flip-flops to set the scan flip-flops to desired values, and thereafter the scan flip-flops are operated normally and output values, i.e., scan-out signals SOUT, of the scan flip-flops which have been operated normally are observed to determine whether the logic operation of the LSI chip is normal or not.

LSI chips available in recent years are not only of larger-scale integration and higher-density designs, but also are operable at higher speeds. Therefore, they need to be checked not only for normal logic operation, but also for normal operation at a clock frequency prescribed according to product specifications.

According to a conventional LSI chip testing process, a delay test is conducted. As shown in FIG. 1A of the accompanying drawings, scan flip-flops (scan F/F) are connected into a chain-like pattern, and then, as shown in FIG. 1B of the accompanying drawings, two pulses spaced from each other by a pulse interval ("Spec" in FIG. 1B) corresponding to the period of a clock signal (having a frequency of 100 MHz or higher, for example) prescribed according to product specifications are input as clocks A, B in FIGS. 1A and 1B from a testing device to a given path (Path). Output values from desired two flip-flops are observed to determine whether the LSI chip malfunctions due to a delay caused by elements such as logic circuits or not.

In the conventional LSI chip testing process, the two in the delay test are generated by an LSI tester, and supplied directly to the scan path test circuit in the LSI chip.

The conventional LSI chip testing process is problematic in that since a frequency which can be used in the delay test depends on the performance of a driver circuit of the LSI tester for outputting the two pulses, LSI chips which operate at high speeds cannot be put to the delay test unless the LSI tester is expensive enough to output high-speed pulses. Specifically, recent LSI chips have internal clock frequencies up to several hundreds MHz, and very expensive LSI tester is needed to test such LSI chips.

SUMMARY OF INVENTION

It is therefore an object of the present invention to provide a semiconductor integrated circuit device which can inexpensively be put to a scan test using a scan path test circuit, and a device for testing such a semiconductor integrated circuit device.

To achieve the above object, there is provided in accordance with the present invention a semiconductor integrated circuit device for being put to a delay test using a scan path test circuit incorporated therein for a scan path test, comprising a two-pulse generator for generating two pulses spaced from each other by a pulse interval equal to the period of a test clock for the delay test which is input from an external source, from the test clock, and supplying the generated two pulses to the scan path test circuit.

The semiconductor integrated circuit device may further comprise a PLL circuit for multiplying the frequency of the test clock and supplying a signal having the multiplied-frequency to the two-pulse generator.

The two-pulse generator may comprise a gate signal generator for generating a gate signal to extract two pulses from the test clock, and a latch gate circuit for outputting two pulses from the test clock according to the gate signal.

According to the present invention there is also provided a device for testing a semiconductor integrated circuit device for being put to a delay test using a scan path test circuit incorporated in the semiconductor integrated circuit device for a scan path test, comprising a test board on which a semiconductor integrated circuit device to be tested is removably mounted, and a two-pulse generator mounted on the test board, for generating two pulses spaced from each other by a pulse interval equal to the period of a test clock for the delay test, from the test clock, and supplying the generated two pulses to the scan path test circuit.

The device may further comprise a PLL circuit mounted on the test board, for multiplying the frequency of the test clock and supplying a signal having the multiplied-frequency to the two-pulse generator.

The device may further comprise a clock generator for outputting the test clock.

In the device, the two-pulse generator may comprise a gate signal generator for generating a gate signal to extract two pulses from the test clock, and a latch gate circuit for outputting two pulses from the test clock according to the gate signal.

The device may further comprise a frequency divider mounted on the test board, for dividing the frequency of the test clock into a frequency which can easily be measured.

According to the present invention, there is further provided a device for testing a semiconductor integrated circuit device, comprising a test board on which the above semiconductor integrated circuit device is removably mounted, and a clock generator mounted on the test board, for outputting the test clock.

The device may further comprise a second PLL circuit mounted on the test board, for multiplying the frequency of the test clock and supplying a signal having the multiplied-frequency to the semiconductor integrated circuit device, and also a frequency divider mounted on the test board, for dividing the frequency of the test clock into a frequency which can easily be measured.

With the above arrangement, since the two-pulse generator for generating two pulses spaced from each other by a pulse interval equal to the period of the test clock and supplying the generated two pulses to the scan path test circuit is mounted on the test board or incorporated in the semiconductor integrated circuit device, the delay test can be conducted using the scan path test circuit with an inexpensive circuit arrangement.

The PLL circuit for multiplying the frequency of the test clock and supplying a signal having the multiplied-frequency to the two-pulse generator allows the frequency of the test clock supplied to the two-pulse generator to be lower. Therefore, the clock generator may be of an inexpensive design.

If the two-pulse generator and the PLL circuit are incorporated in the semiconductor integrated circuit device, then the semiconductor integrated circuit device generates a high-speed test clock therein without the need for inputting a high-speed test clock to its input terminal. Therefore, semiconductor integrated circuit devices operating at high speeds can be put to the delay test. Furthermore, because any malfunctions which would otherwise be caused if a high-speed clock were input to the input terminal of semiconductor integrated circuit devices are prevented from occurring, semiconductor integrated circuit devices operating at high speeds can be put to the delay test reliably without malfunctions.

The above and other objects, features, and advantages of the present invention will become apparent from the following description with reference to the accompanying drawings which illustrate examples of the present invention.

DETAILED DESCRIPTION

1st Embodiment

Figure 1A:
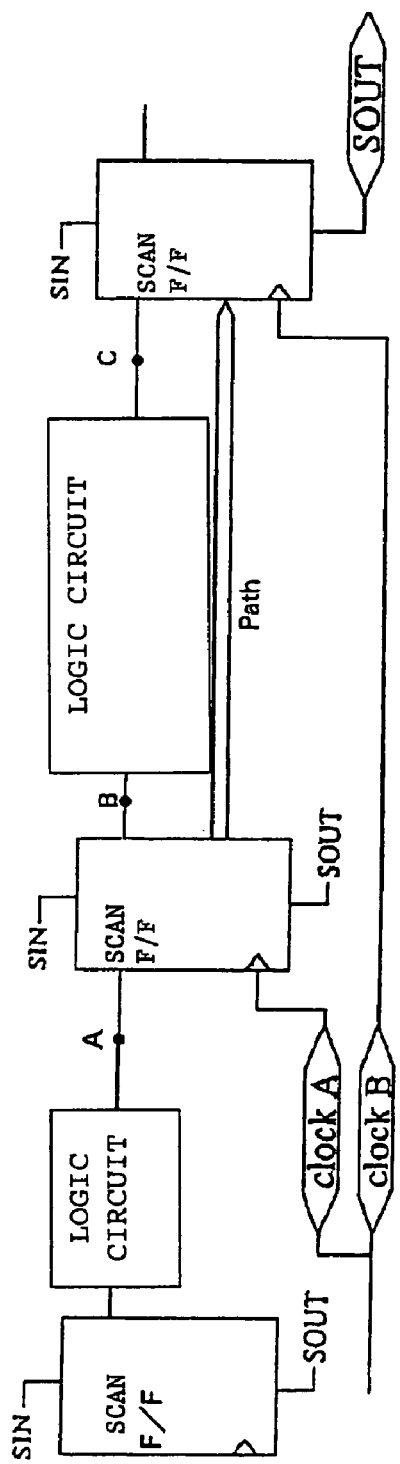
FIG. 1A is a block diagram of a scan path test circuit, showing a process of testing a conventional semiconductor integrated circuit device.
Figure 1B:
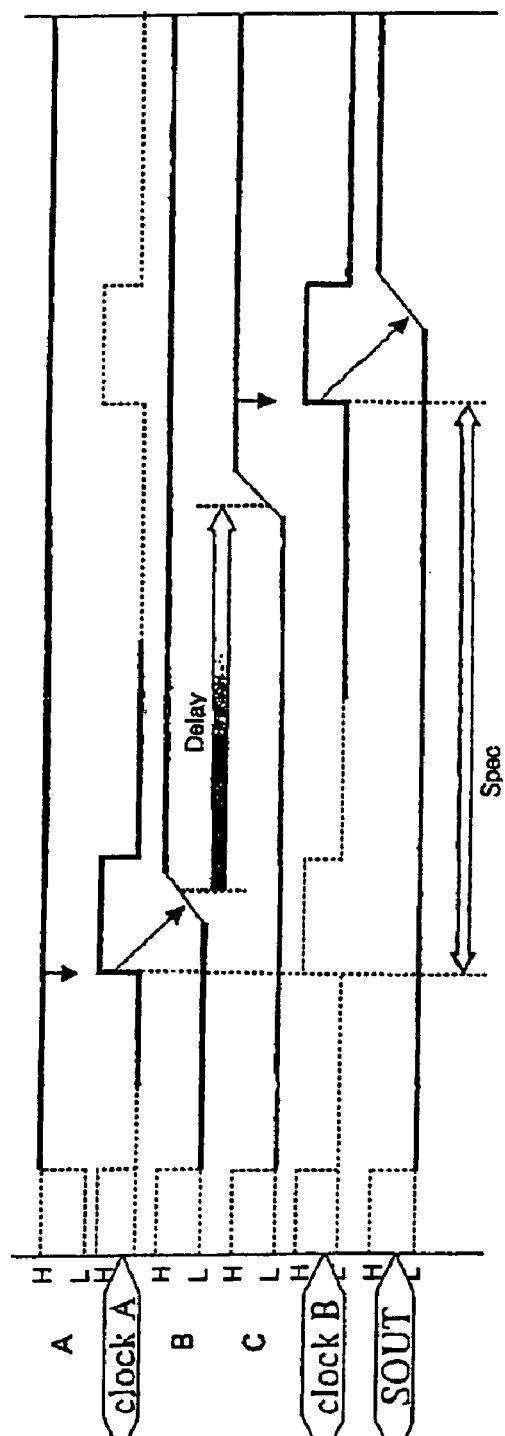
FIG. 1B is a timing chart of signals in a delay test using the scan path test circuit shown in FIG. 1A.
Figure 2:
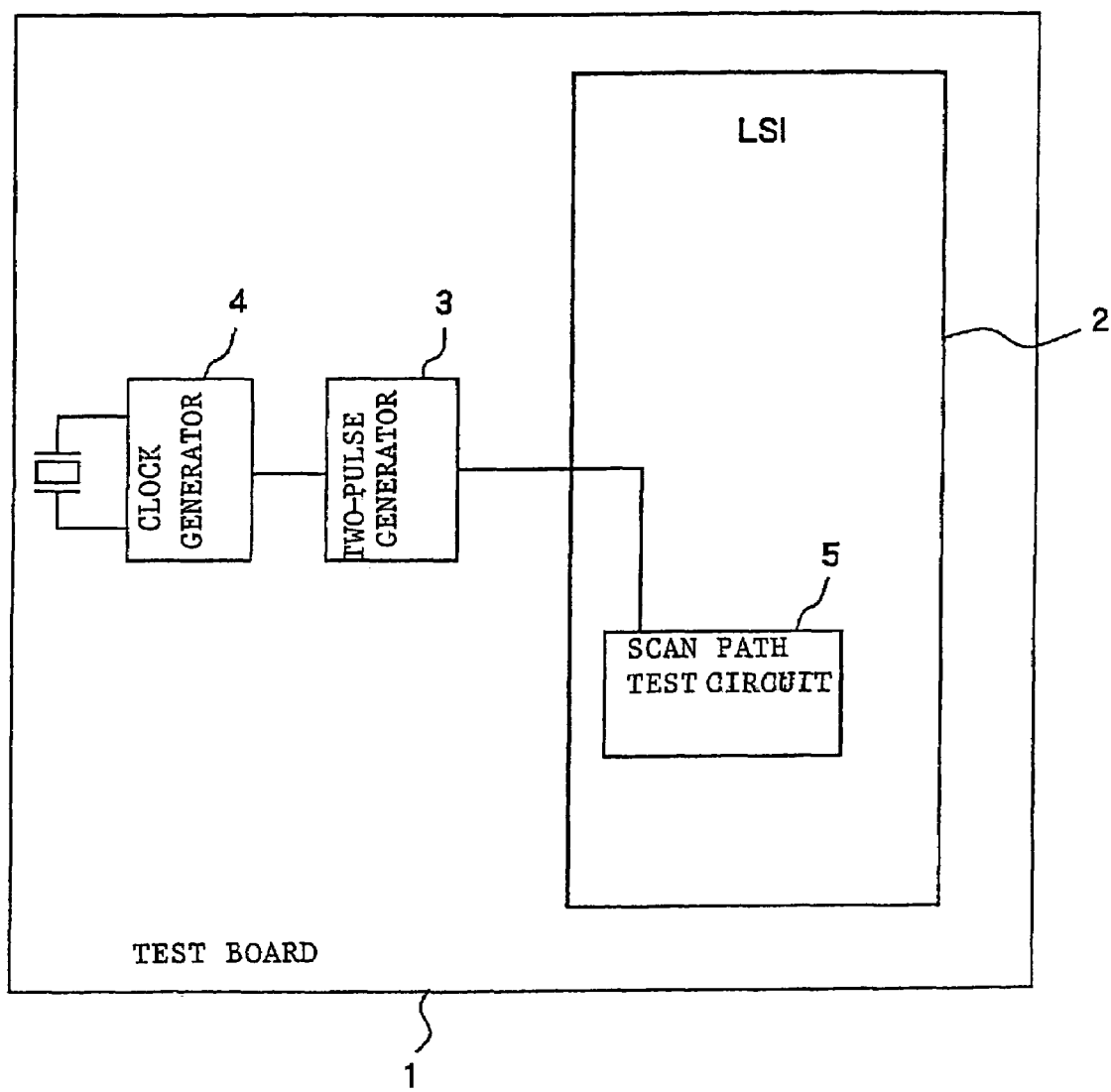
FIG. 2 is a block diagram of a device for testing a semiconductor integrated circuit device according to a first embodiment of the present invention.
Figure 3:
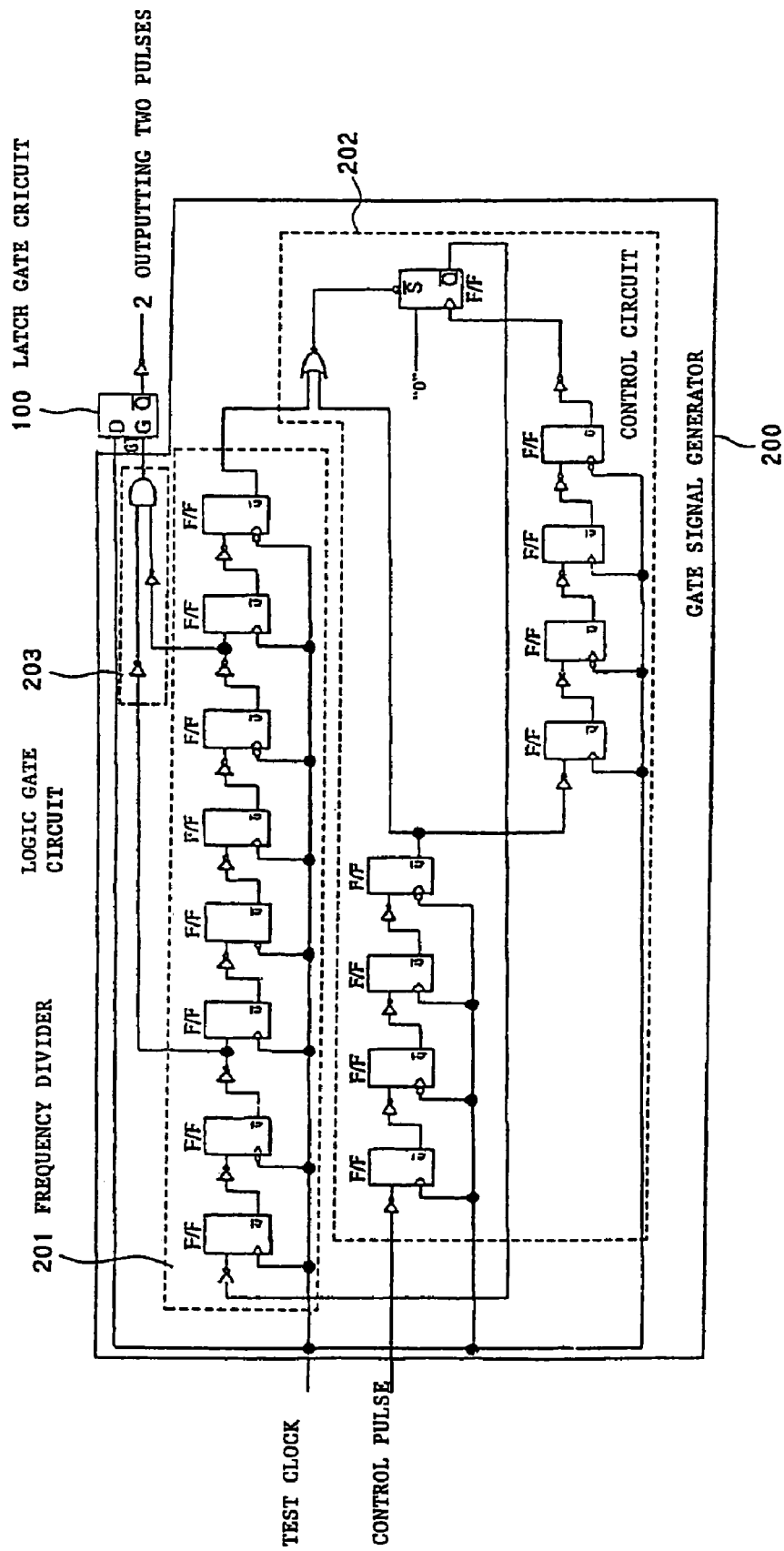
FIG. 3 is a circuit diagram of a two-pulse generator in the device shown in FIG. 2.
Figure 4:
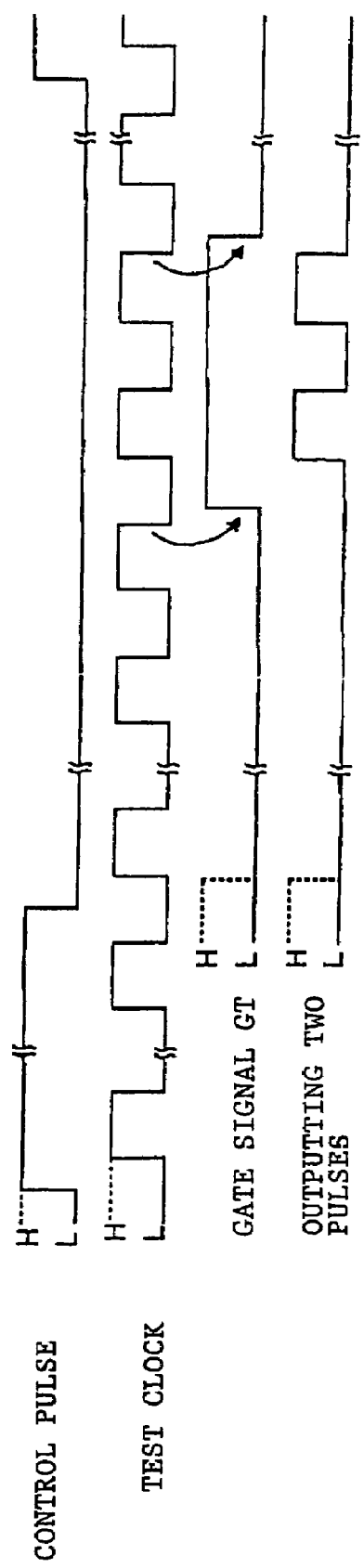
FIG. 4 is a timing chart of signals showing the manner in which the two-pulse generator shown in FIG. 3 operates.

FIG. 2 shows in block form a device for testing a semiconductor integrated circuit device according to a first embodiment of the present invention. FIG. 3 shows a two-pulse generator in the device shown in FIG. 2, and FIG. 4 shows the manner in which the two-pulse generator shown in FIG. 3 operates.

As shown in FIG. 2, the device for testing a semiconductor integrated circuit device according to a first embodiment of the present invention has test board 1 on which LSI chip 2 to be tested is removably placed, two-pulse generator 3 mounted on test board 1 for generating two pulses for a delay test which are to be supplied to LSI chip 2, and clock generator 4 mounted on test board 1 for generating a test clock for operating two-pulse generator 3 at a suitable timing.

Clock generator 4 generates a test clock having a frequency for use in a delay test. Two-pulse generator 3 extracts two pulses from the test block in timed relation to a control pulse input from an external source, and supplies the extracted two pulses to scan path test circuit 5 which LSI chip 2 has.

Two-pulse generator 3 may not necessarily be supplied with a test clock from clock generator 4, but may be supplied with a test clock having a given frequency from a general-purpose oscillator or a tester.

As shown in FIG. 3, two-pulse generator 3 comprises latch gate circuit 100 for outputting two pulses from the test clock according to a gate signal GT having a predetermined pulse duration, and gate signal generator 200 for generating the gate signal GT.

Gate signal generator 200 has frequency divider 201 for frequency-dividing the test clock, control circuit 202 for operating frequency divider 201 a given number of pulses counted after the control pulse is input to control circuit 202, and a logic gate circuit 203 for generating the gate signal GT from a signal in frequency divider 201.

Frequency divider 201 has a plurality of flip-flops F/F connected in series for shifting an input signal in synchronism with positive- and negative-going edges of the test clock. Logic gate circuit 203 generates the gate signal GT by ANDing two of the output pulses of the flip-flops F/F of frequency divider 201.

Control circuit 202 has a plurality of flip-flops F/F connected in series for shifting the control pulse in synchronism with positive- and negative-going edges of the test clock. Control circuit 202 returns the output pulses of the flip-flops F/F of frequency divider 201 to the input terminal thereof, through a feedback loop, a given number of pulses counted after the control pulse is input to control circuit 202.

In FIG. 3, each of frequency divider 201 and control circuit 202 comprises eight flip-flops for shifting the input signal. However, gate signal generator 200 is not limited to the circuit arrangement shown in FIG. 3, but may be of any circuit arrangements insofar as they are capable of generating a gate signal GT for enabling latch gate circuit 100 to output two pulses from the test clock.

As shown in FIG. 4, when the control pulse is input to two-pulse generator 3, a given number of pulses of the test clock are counted from the input of the control pulse, and thereafter frequency divider 201 starts operating to generate the gate signal GT. Latch gate circuit 100 passes the test block only while the gate signal GT is "H", outputting a clock of two pulses for a delay test.

With two-pulse generator 3 being mounted on test board 1 for placing LSI chip 2 under test, LSI chip 2 can be put to the delay test using the scan path test with an inexpensive circuit arrangement.

2nd Embodiment

Figure 5:
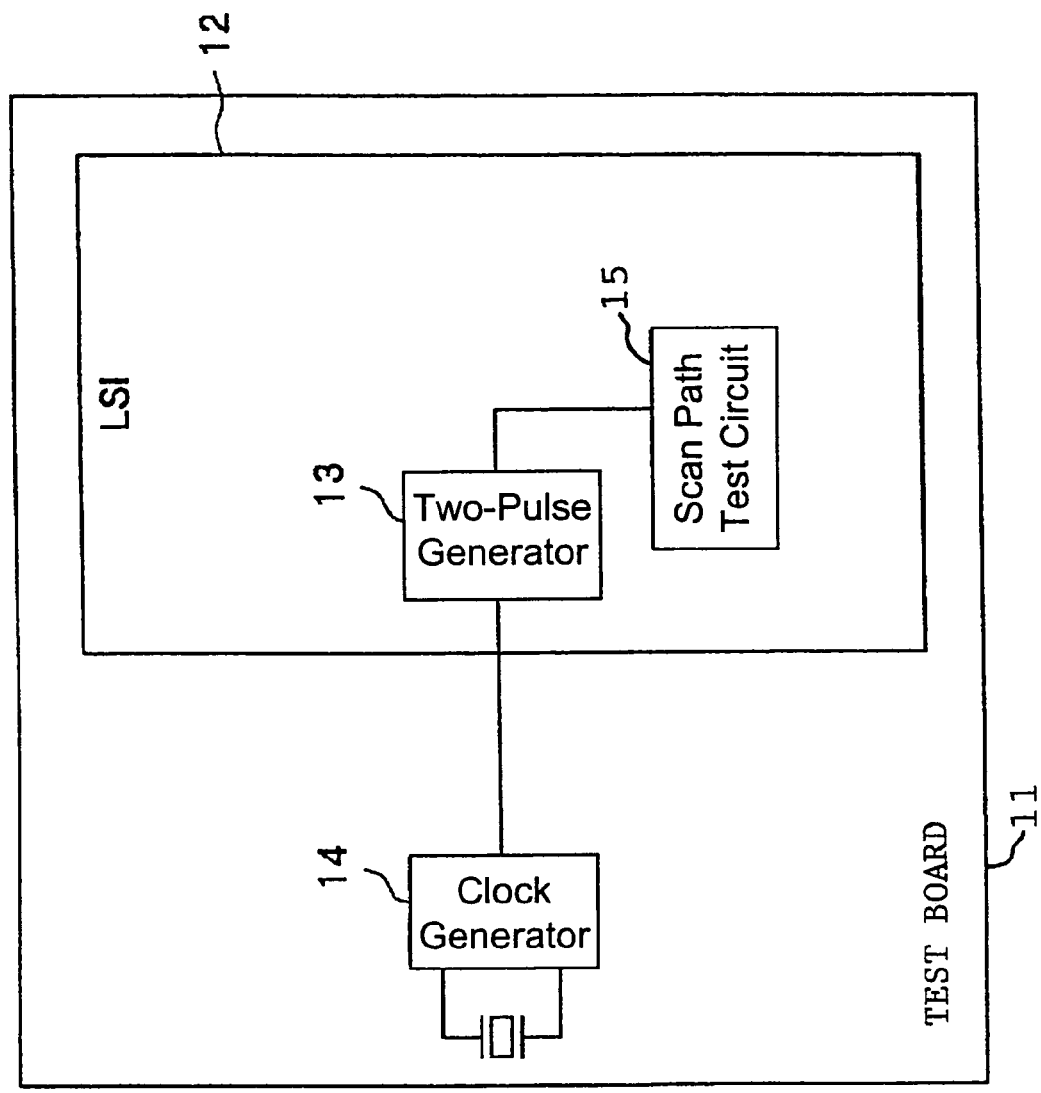
FIG. 5 is a block diagram of a device for testing a semiconductor integrated circuit device according to a second embodiment of the present invention.

FIG. 5 shows in block form a device for testing a semiconductor integrated circuit device according to a second embodiment of the present invention.

As shown in FIG. 5, the testing device according to the second embodiment differs from the testing device according to the first embodiment in that two-pulse generator 13 which is identical to the two-pulse generator according to the first embodiment is incorporated in LSI 12 to be tested. The testing device according to the second embodiment has clock generator 14 which is identical to the clock generator according to the first embodiment. Therefore, details of clock generator 14 will not be described below.

With two-pulse generator 13 being incorporated in LSI chip 12, LSI chip 12 can be put to a delay test simply by supplying a test clock having a predetermined frequency from clock generator 14 or a general-purpose oscillator or a tester to the test board.

3rd Embodiment

Figure 6:
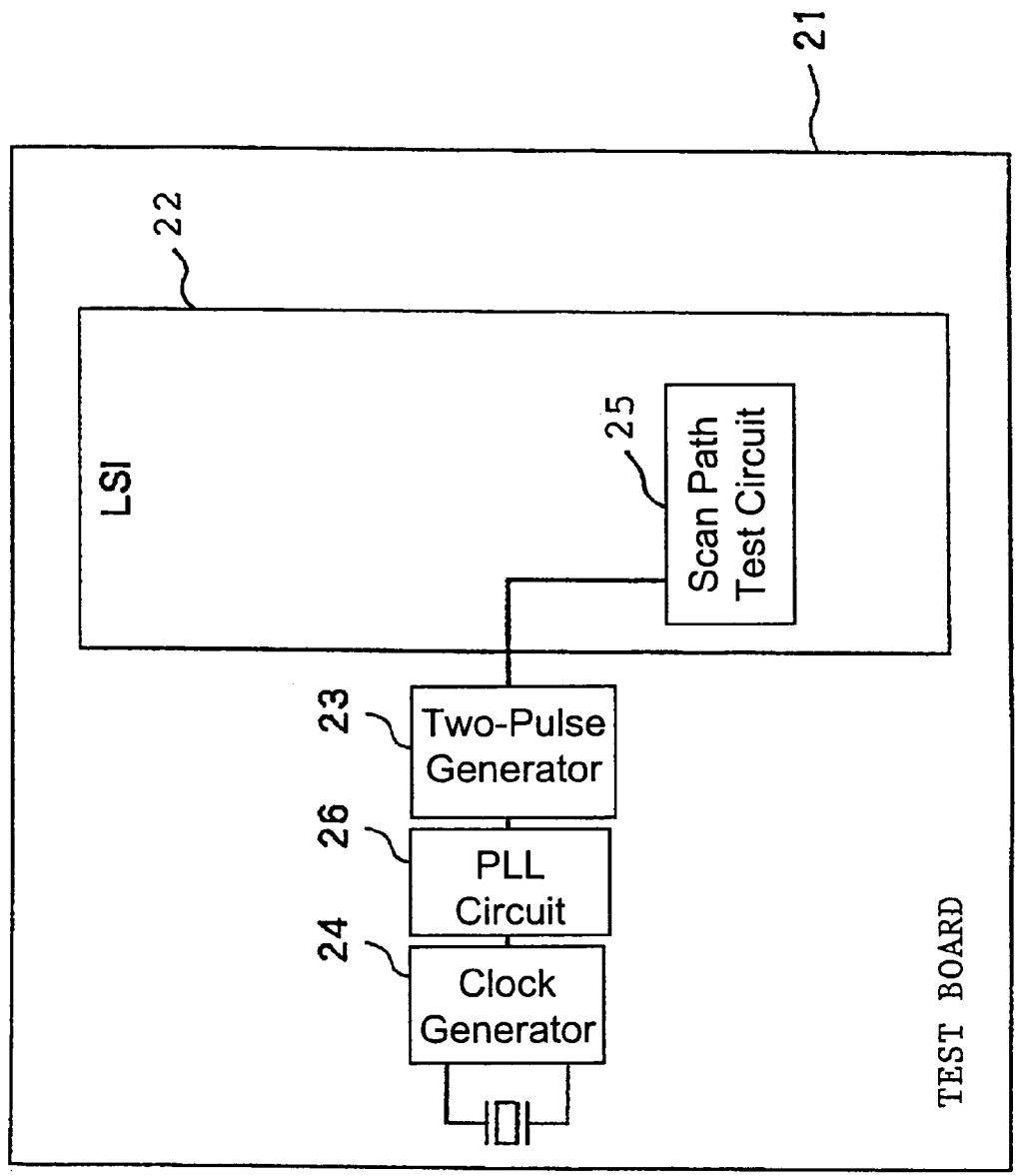
FIG. 6 is a block diagram of a device for testing a semiconductor integrated circuit device according to a third embodiment of the present invention.

FIG. 6 shows in block form a device for testing a semiconductor integrated circuit device according to a third embodiment of the present invention.

As shown in FIG. 6, the testing device according to the third embodiment differs from the testing device according to the first embodiment in that PLL (Phase-Locked Loop) circuit 26 for multiplying the frequency of the test clock output from clock generator 24 and supplying a signal having the multiplied-frequency signal to two-pulse generator 23 is additionally mounted on test board 21. PLL circuit 26 may comprise a phase comparator, a VCO (Voltage-Controlled Oscillator), a loop filter, and a frequency divider, which are of known nature. Two-pulse generator 23 and clock generator 24 are identical to those according to the first embodiment, and will not be described in detail below.

In the third embodiment, since the frequency of the test clock output from clock generator 24 is multiplied by PLL circuit 26, the frequency of the test clock generated by clock generator 24 may be lower. Therefore, clock generator 24 may be of an inexpensive design. If a general-purpose oscillator or a tester is used instead of clock generator 24, such a general-purpose oscillator or a tester may also be of an inexpensive design.

4th Embodiment

Figure 7:
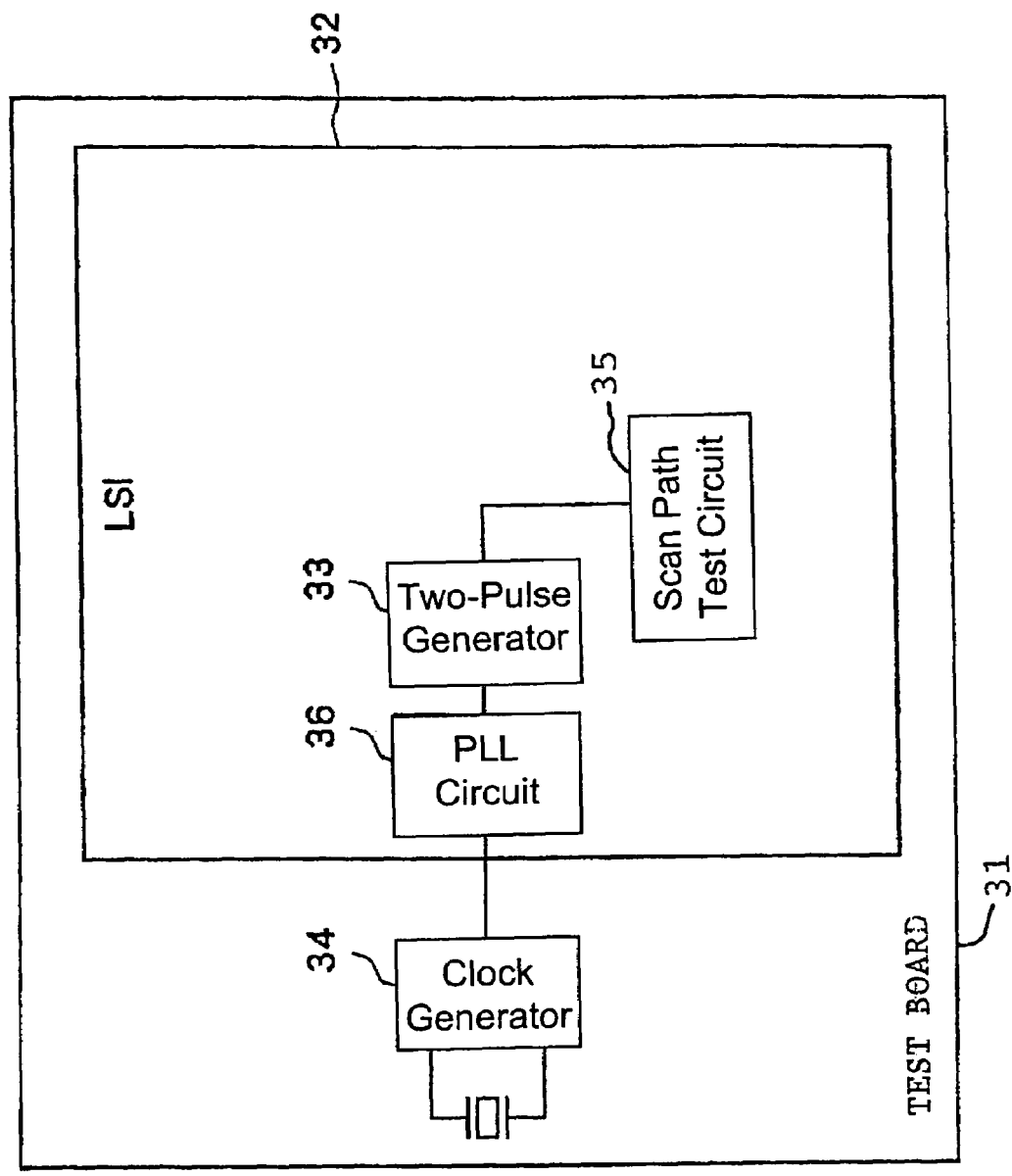
FIG. 7 is a block diagram of a device for testing a semiconductor integrated circuit device according to a fourth embodiment of the present invention.

FIG. 7 shows in block form a device for testing a semiconductor integrated circuit device according to a fourth embodiment of the present invention.

As shown in FIG. 7, the testing device according to the fourth embodiment differs from the testing device according to the third embodiment in that PLL circuit 36 and two-pulse generator 33 which are identical to those according to the third embodiment are incorporated in LSI chip 32 to be tested. The testing device according to the fourth embodiment has clock generator 34 which is identical to the clock generator according to the first embodiment. Therefore, details of clock generator 34 will not be described below.

Usually, since input terminals of an LSI chip have an inductive component and a capacitive component, a clock frequency that can normally input to the LSI chip is limited to about 200 MHz or lower. In the third embodiment, with PLL circuit 36 and two-pulse generator 33 being incorporated in LSI chip 32 to be tested, LSI chip 32 generates a high-speed test clock therein without the need for inputting a high-speed test clock to its input terminal. Therefore, LSI chips operating at high speeds can be put to the delay test. Furthermore, because any malfunctions which would otherwise be caused if a high-speed clock were input to the input terminal of LSI chips are prevented from occurring, LSI chips operating at high speeds can be put to the delay test reliably without malfunctions.

5th Embodiment

Figure 8:
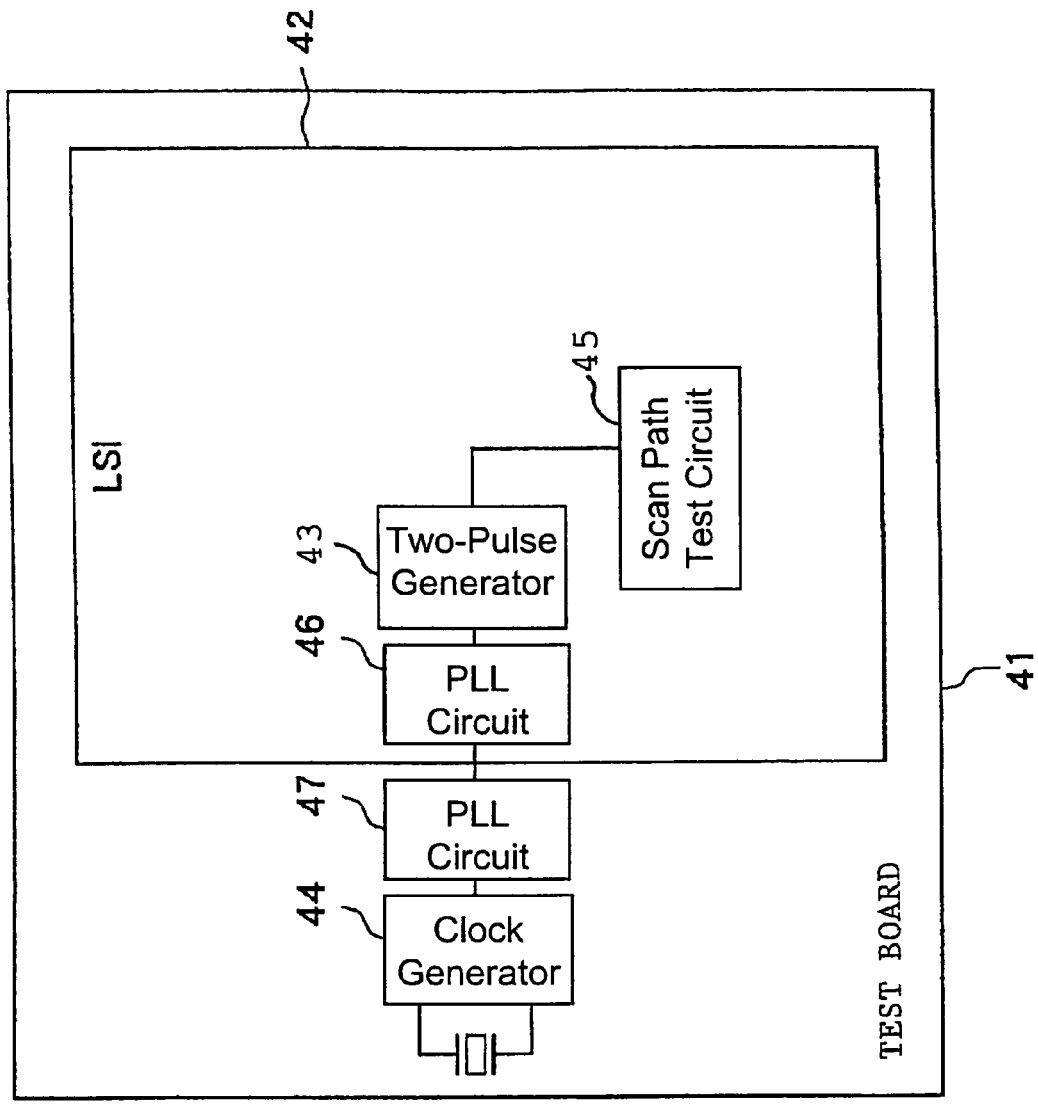
FIG. 8 is a block diagram of a device for testing a semiconductor integrated circuit device according to a sixth embodiment of the present invention.

FIG. 8 shows in block form a device for testing a semiconductor integrated circuit device according to a fifth embodiment of the present invention.

As shown in FIG. 8, the testing device according to the fifth embodiment differs from the testing device according to the fourth embodiment in that PLL circuit 47 for multiplying the frequency of the test clock output from clock generator 44 and supplying the multiplied-frequency signal to a two-pulse generator is additionally mounted on test board 41 on which LSI 42 is mounted. Two-pulse generator and clock generator 44 are identical to those according to the first embodiment, and will not be described in detail below.

In the fifth embodiment, since the frequency of the test clock output from clock generator 44 is multiplied by PLL circuit 47 on test board 41, and further multiplied by PLL circuit 46 in LSI chip 42 to be tested, the frequency of the test clock generated by clock generator 44 may be much lower. Therefore, clock generator 44 may be of an inexpensive design. If a general-purpose oscillator or a tester is used instead of clock generator 44, such a general-purpose oscillator or a tester may also be of an inexpensive design.

In order to confirm the frequency of the test clock output from the clock generator or the PLL circuit in the first through fifth embodiments, a frequency divider for frequency-dividing the test block may be mounted on the test board. The frequency of the clock output from the frequency divider may be measured by a known frequency counter.

While preferred embodiments of the present invention have been described using specific terms, such description is for illustrative purposes only, and it is to be understood that changes and variations may be made without departing from the spirit or scope of the appended claims.

What is claimed is:

1. A test circuit for a semiconductor integrated circuit device for being put to a delay test using a scan path test circuit incorporated on said semiconductor integrated circuit device for a scan path test, comprising:

a two-pulse generator for generating two pulses spaced from each other by a pulse interval equal to a period of a test clock for the delay test, said test clock being input from an external source, and supplying the generated two pulses to the scan path test circuit, said two-pulse generator comprises a gate signal generator for generating a gate signal to extract two pulses from said test clock and a latch gate circuit for outputting two pulses from said test clock according to said gate signal, said gate signal generator generating one of a positive and negative edge of said gate signal at a predetermined time delay after a negative edge of said test clock as measured from an input timing of a control signal.

2. The test circuit according to claim 1, wherein said test circuit is fabricated in said semiconductor integrated circuit device and further comprises:

a PLL circuit for multiplying a frequency of said test clock and supplying a signal having the multiplied-frequency to said two-pulse generator.

3. The test circuit according to claim 1, wherein said test circuit is mounted on a test board, and said semiconductor integrated circuit device is removably mounted on said test board.

4. The test circuit according to claim 3, further comprising: a PLL circuit for multiplying the frequency of said test clock and supplying a signal having the multiplied-frequency to said two-pulse generator.

5. The test circuit according to claim 3, further comprising: a clock generator for outputting said test clock. a test board on which a semiconductor integrated circuit device is removably mounted.

6. The test circuit according to claim 3, furthering comprising: a frequency divider mounted on said test board, for dividing the frequency of said test clock into a lower frequency.

7. The test circuit according to claim 1, further comprising: a clock generator for outputting said test clock, wherein said two-pulse generator is fabricated in said semiconductor integrated circuit device, and said semiconductor integrated circuit device is removably mounted to a test board, and said clock generator is mounted on said test board.

8. The test circuit according to claim 7, further comprising: a PLL circuit for multiplying the frequency of said test clock and supplying a signal having the multiplied-frequency to said two-pulse generator, wherein said PLL circuit is fabricated in said semiconductor integrated circuit device.

9. The test circuit according to claim 7, further comprising: a second PLL circuit mounted on said test board, for multiplying a frequency of said test clock and supplying a signal having the multiplied-frequency to said semiconductor integrated circuit device.

10. The test circuit according to claim 7, further comprising: a frequency divider mounted on said test board, for dividing a frequency of said test clock into a lower frequency.

11. The test circuit according to claim 1, wherein said gate signal generator comprises a control circuit for adjusting a timing of said gate signal.

12. The test circuit according to claim 11, wherein said control circuit counts said test clock for adjusting said timing of said gate signal.

* * * * *